United States Patent [19]

Tenney et al.

[11] Patent Number: 5,190,808
[45] Date of Patent: Mar. 2, 1993

[54] PREPREG COMPRISING SATURATED OR UNSATURATED SILANE SUBSTITUTED CYCLIC GROUP

[75] Inventors: Linwood P. Tenney, Birmingham, Ala.; Timothy J. Kettering, Middleburg Hgts., Ohio; Robert J. Minchak, Parma Hgts., Ohio; George M. Benedikt, Macedonia, Ohio; David J. Smith, Sheffield Lake, Ohio

[73] Assignee: B. F. Goodrich Company, Akron, Ohio

[21] Appl. No.: 751,640

[22] Filed: Aug. 26, 1991

Related U.S. Application Data

[62] Division of Ser. No. 440,146, Nov. 22, 1989, Pat. No. 5,071,701.

[51] Int. Cl.$^5$ ................................................ B32B 9/00
[52] U.S. Cl. ........................................ 428/224; 428/209; 428/285; 428/284; 428/288; 428/446; 428/447; 428/901
[58] Field of Search ................ 428/224, 209, 285, 284, 428/288, 446, 447, 901

[56] References Cited

U.S. PATENT DOCUMENTS 5,071,701 12/1991 Tenney .................................. 428/285

Primary Examiner—Patrick J. Ryan
Assistant Examiner—Richard Weisberger
Attorney, Agent, or Firm—Venable, Baetjer, Howard & Civiletti

[57] ABSTRACT

Copolymers for use in preparing prepregs, which in turn are used to prepare printed circuit wiring boards are provided, as well as processes for producing the prepregs and wiring boards. The copolymers comprise repeating units derived from cycloolefin monomers, e.g., norbornene-type monomers, e.g., dicyclopentadiene-type monomers. Some of the monomers are silane-substituted while others are non silane-substituted. The silane-substituted monomers provide copolymers which exhibit improved properties when employed as the copolymers in prepregs for printed circuit wiring boards. For example, improved adhesion is achieved between the noncellulosic substrate and the polymers of components used in the wiring boards. These properties include, but are not limited to improved dielectric properties, improved adhesion to glass cloth substrates, etc.

10 Claims, No Drawings

PREPREG COMPRISING SATURATED OR UNSATURATED SILANE SUBSTITUTED CYCLIC GROUP

This application is a division of application Ser. No. 07/440,146, filed Nov. 22, 1989, is now U.S. Pat. No. 5,071,701.

CROSS-REFERENCE TO RELATED APPLICATIONS

This application is related to U.S. Ser. No. 309,857, filed Feb. 14, 1989 is now U.S. Pat. No. 4,923,678 and U.S. Ser. No. 288,999, filed Dec. 23, 1988, now U.S. Pat. No. 4,923,734 which are assigned to the same assignees as the present invention. The entirety of these disclosures are incorporated by reference herein.

BACKGROUND OF THE INVENTION

This invention relates to printed circuit wiring boards, prepregs from which they are prepared and to copolymers from which the prepregs are prepared. The copolymers comprise repeating units of polynorbornene structures. Some of the structures have been substituted with a silane substitutent and some have not been substituted. The silane substitution provides increased adhesion to various substrates, for example, glass cloth and copper.

Printed circuit wiring boards generally comprise at least one layer of glass cloth which has been impregnated with a polymer or copolymer. These wiring boards are fabricated from prepregs. Prepregs are generally formed of glass cloth which has been impregnated with a polymer or copolymer and then partially cured so that further curing can take place. The prepregs are then generally arranged in a stacking sequence and subjected to heat and pressure so as to form a cured laminate.

The laminates generally comprise at least one layer of prepreg and at least one layer of a conductive film, such as copper, which when imaged and etched serve to provide a printed circuit wiring board substrate.

Typical printed circuit wiring boards are single layer or multilayer in configuration. The typical single layer printed circuit wiring board comprises a central prepreg/substrate layer to which have been laminated two layers of conductive film (optionally only a single layer of conductive film may be laminated to the substrate layer). The conductive film is then imaged and etched to form the printed circuit mentioned above. If a multilayer printed circuit wiring board is desired, this procedure can be repeated. Thus, typically, a structure similar to a single layer printed circuit wiring board is fabricated comprising a prepreg substrate core and imaged and etched conductive film patterns on each major surface of the substrate. Subsequently, additional layers of prepreg are configured in a stacking sequence on each major surface together with one or two layers of conductive film on the exterior major surfaces of the additional prepreg layers. The sequence is then subjected to heat and pressure in order to form a multilayer laminate comprising layers of conductive film, prepreg, conductive film, prepreg, etc.

Cellulosic and fiberglass cloths have long been used to reinforce polymeric substrates such as the prepregs discussed above. It is known that silane coupling agents can be applied directly to glass filaments to improve the properties, such as the strength of laminates such as those discussed above, often by as much as 300% for compression molded test samples. It is believed that silane coupling agents at the interface allow many particulate materials to act as reinforcing fillers in such laminates to increase various properties, such as strength, hardness, modulus, heat distortion and impact strength. Fiberglass cloth is usually treated with a solution of a coupling agent. This coupling agent can be a silane coupling agent and can be applied directly to the glass cloth.

The precise nature of the mechanism in which silane increases adhesion is not entirely understood. Silane coupling agents modify the interface between organic resin surfaces and non-resins to improve adhesion. The physical properties are improved as a result. It is possible that the silane coupling agents form bonds with the non-resin surfaces and resin surfaces through the silane functional group. Hydrolyzed silanes condense to oligomeric siloxanols and eventually to rigid cross-linked structures. Contact with a polymer matrix should take place while the siloxanols still have some solubility. The bonding to a polymer matrix may take various different forms. Bonding may be covalent where the siloxanol is compatible with the liquid matrix resin. The solutions might also form an interpenetrating polymer network as the siloxanols and the resins separately cure with only limited copolymerization.

It is well known that not all silanes or mixtures of silanes will bond all metals to all substrates. In McGee, U.S. Pat. No. 4,315,970, it is stated that:

[i]t is generally accepted that specific silanes can be used for adhesion of specific materials to specific substrates. That is, the silane must be matched to the application and it cannot be assumed that all silanes will work in all applications.

This statement illustrates the unpredictability of the suitability of silane coupling agents in improving adhesion of a metal to a substrate. Thus, this suitability must be determined by experimentation.

While suitable coupling agents are commercially available for bonding of many common plastics with a variety of metals, the application of silane coupling agents for bonding of polynorbornenes to metals has only recently been developed (see U.S. Ser. No. 228,034, filed Aug. 4, 1988 and commonly assigned to the same assignee as the present invention). Norbornene-type monomers are polymerized by either a ring-opening mechanism or by an addition reaction wherein the cyclic ring structure remains intact. Ring-opening polymerization generally yields unsaturated linear polymers while addition polymerization yields polycycloaliphatics. It is desirable to produce polymers having high molecular weight repeating units incorporated therein to provide good temperature resistance, i.e., high heat distortion temperatures and high glass transition temperatures.

CA98:162025n and 98:162026p disclose laminates for use in preparing printed circuit boards. The laminates comprise an assembly of prepregs of paper-reinforced phenolic resin and copper foil. Polyethylene may be employed as an intermediate layer between the copper foil and the prepregs. The polyethylene layer is silane-modified in the presence of a radical-generating agent and is employed as an adhesive layer.

CA107:8574p discloses laminates of glass fibers impregnated with silicon-modified epoxy resins which also contain polyethylene. A six-layered wiring board is prepared from 15 sheets of the prepreg and 6 sheets of copper foil. CA107:8575q discloses similar laminates wherein epoxy resins, guanidine derivatives, fluoroplastics or polyolefins are employed as the resin.

"Some Approaches to Low-dielectric Constant Matrix Resins for Printed Circuit Boards", Butler, et al., 15th National SAMPE Technical Conference, 1983, discloses general design considerations in the preparation of printed circuit boards. It discloses that the thermal cyclization of materials to form multicyclic structures has been employed in the preparation of printed circuit boards. It discloses that "conventional silane reactions" may be employed to overcome the shortcomings of silicon and that siloxane is a "desirable group[s] for polymer segment structures". It also discloses that coupling agents to improve adhesion can be employed.

Although printed circuit wiring boards employing various materials, e.g., those discussed above, are available, serious deficiencies in properties still exist, such as good adhesion, low dielectric constant, good punchability, good molten solder resistance characteristics and improved peel strength. Prior art printed circuit wiring board substrates fall short of optimizing these parameters and providing a spectrum of properties which is optimal. Thus, there has been a continuing need for improvement.

SUMMARY OF THE INVENTION

It is an object of this invention to provide printed circuit wiring boards having improved interlayer adhesion. It is a further object of this invention to provide such printed circuit wiring boards having an improved spectrum of overall properties, such as improved dielectric activities, molten solder resistance, peel strength, punchability, etc. In one aspect of this invention, these objects are obtained by providing a printed circuit wiring board comprising a conductive film laminated to a prepreg layer comprising a glass cloth impregnated with a polycycloolefin copolymer comprising silane-substituted repeating units derived by ring-opening polymerization from monomers of the formula

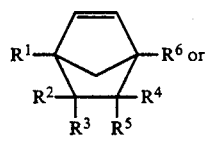

I

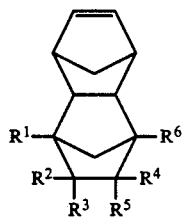

II wherein $R^1$ and $R^6$ is each independently selected from H, halogen, $CH_3$, or $C_2$–$C_{10}$ alkyl;

$R^3$ and $R^5$ is each independently selected from H, halogen, $CH_3$, $C_2$–$C_{10}$ alkyl, $C_2$–$C_{10}$ alkene, $C_6$–$C_{12}$ cycloalkyl, $C_6$–$C_{12}$ cycloalkene, $C_6$–$C_{12}$ aryl, or $C_6$–$C_{12}$ aryl substituted by $C_1$–$C_{10}$ alkyl, or a silane group, or $R^3$ and $R^5$ together form a saturated or unsaturated cyclic or multicyclic alkylene group of from 2–10 carbon atoms; and $R^2$ and $R^4$ is each independently selected from H or a silane group.

It will be understood that at least one of $R^2$ and $R^4$ is substituted by a silane group when $R^3$ and $R^5$ do not together form a cyclic alkylene group. When $R^3$ and $R^5$ form a cyclic alkylene group, this group is preferably silane substituted.

It will also be understood that the cyclic or multicyclic alkylene group of $R^3$–$R^5$ is meant to include compounds wherein $R^3$–$R^5$ form cyclohexyl-type structures fused to the ring of the structure set forth in the formula. Thus, $R^3$ and $R^5$ can form a norbornyl-type structure.

$R^2$ through $R^4$ can also be a polar substituent such as a nitrile-, ester-, acrylate-, halogen- or sulfur-containing group.

In another, preferred aspect of this invention, these objects are obtained by providing a printed circuit wiring board comprising a conductive film laminated to a prepreg layer comprising a glass cloth impregnated with a polycyclic copolymer comprising silane-substituted repeating units derived from monomers of the formulas

III

IV wherein n=1–4 and $R^7$ and $R^8$ are independently selected from hydrogen, halogen, $C_1$–$C_{12}$ alkyl groups, $C_2$–$C_{12}$ alkylene groups, $C_6$–$C_{12}$ cycloalkyl groups, $C_6$–$C_{12}$ cycloalkylene groups and $C_6$–$C_{12}$ aryl groups, silane or $R^7$ and $R^8$ together form saturated or unsaturated cyclic groups of from 4 to 12 carbon atoms with the two ring carbon atoms connected thereto, said ring carbon atoms forming part of and contributing to the 4 to 12 carbon atoms in the cyclic group. At least one of $R^7$ and $R^8$ is substituted by a silane group, when $R^7$ and $R^8$ do not together form a cyclic group or groups. When $R^7$ and $R^8$ do together form a cyclic group or groups, the $R^7$–$R^8$ cyclic structure is silane substituted.

The prepregs produced from the copolymers of this invention have low dielectric constants, e.g., from 3.5 –2.6, preferably from 3.3 –2.6. In highly preferred embodiments, dielectric constants of 3.0 or lower are obtained. The prepregs of this invention also have low dissipation factors, for example, the prepregs of this invention have dissipation factors of from 0.01 –0.001, preferably from 0.007–0.001. In highly preferred embodiments of this invention, the prepregs of this invention have a dissipation factor of 0.003 or lower.

The invention also provides related laminates, as well as copolymers derived from the above-identified monomers.

DETAILED DESCRIPTION OF THE INVENTION

This invention provides laminates, particularly printed circuit wiring boards, having a superior spectrum of properties. In particular, the printed circuit wiring boards of this invention have a superior spectrum of dielectric and structural properties, including lower dielectric constants and increased adhesion. They are prepared by laminating a substrate layer, such as one or more prepregs of fiberglass-reinforced silane-substituted polynorbornene copolymer to a conductive foil, for example, a copper foil, utilizing a silane coupling agent and optionally an intermediate layer of polyethylene.

In preferred embodiments of this invention, the prepregs are prepared from glass fibers which are impregnated with a polynorbornene by the use of a polynorbornene dipping solution. This solution comprises solubilized polynorbornene polymers. The polymers are obtained from metathesis ring-opening polymerization of cycloolefin monomers having at least one norbornene functional group.

The norbornene monomers (cycloolefin monomers) are characterized by the presence of at least one norbornene moiety, for example, a moiety having a structure of Formula I or II. At least some of the monomer moieties contain a silane substituent, e.g., a substituent of the formula $-SiR^R R^{10} R^{11}$ wherein each of $R^R$, $R^{10}$, $R^{11}$ is selected independently from the group which includes H; halogen; $C_1$-$C_{12}$ alkyl; $C_6$-$C_{12}$ aryl; $C_6$-$C_{12}$ aryl substituted by $C_1$-$C_{12}$ alkyl; $C_1$-$C_{12}$ alkoxy; halogen; or hydroxyl. The alkyl and alkoxy substituents preferably contain 1-4 carbon atoms, most preferably 1-2.

Small amounts of silane-substituted norbornenes containing hetero atoms, (e.g. $-O-$, $-C-$, $-NH-$) can also be included. When employed these compounds comprise 1-10% of the composition based on the total weight of monomeric units present in the polymeric composition, preferably from 1-5%.

These compounds include monomers of the formula

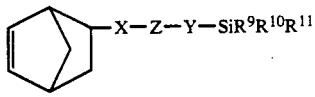   $-X-Z-Y-SiR^9 R^{10} R^{11}$     V wherein X is selected from $-C-$, $-C_6H_4-CH_2-$ or alkylene of from 1-4 carbon atoms, preferably from 1-2 carbon atoms, and most preferably $-CH_2-$;

Z is selected from $-O-$, $-NH-$, $O-CH_2CH_2-O-$, or $-NH-CH_2-CH_2-NH-$;

Y is selected from alkylene of from 1-4 carbon atoms, preferably from 1-3 carbon atoms, and most preferably 3 carbon atoms; and $R^9$, $R^{10}$ and $R^{11}$ are each independently selected from hydrogen; $C_1$-$C_{12}$ alkyl, preferably $C_6$-$C_{12}$ alkyl, most preferably $C_1$-$C_2$ alkyl; $C_6$-$C_{12}$ aryl; $C_6$-$C_{12}$ aryl substituted by $C_1$-$C_{12}$ alkyl; $C_1$-$C_4$ alkoxy; and most preferably $C_1$-$C_2$ alkoxy; halogen; or hydroxyl.

The cycloolefin copolymers comprise repeating units derived from silane-substituted and non silane-substituted cycloolefin monomers. Suitable silane-substituted and non silane-substituted cycloolefin monomers (for clarity the following nomenclature does not name the silane substitutent, although, when silane substituted, these monomers can be the silane-substituted monomers employed in the invention) include substituted and unsubstituted norbornenes, dicyclopentadienes, dihydrodicyclopentadienes, trimers of cyclopentadiene, tetracyclo-dodecenes, hexacycloheptadecenes, ethylidenyl norbornenes and vinylnorbornenes. Substituents on the cycloolefin monomers include hydrogen, alkyl, alkenyl, and aryl groups of 1 to 20 carbon atoms, and saturated and unsaturated cyclic groups of 3 to 12 carbon atoms which can be formed with one or more, preferably two, ring carbon atoms. In a preferred embodiment, the substituents (exclusive of the silane substitutents) are selected from hydrogen and alkyl groups of 1 to 2 carbon atoms. Generally speaking, the substituents on the cycloolefin monomers can be any which do not poison or deactivate the polymerization catalyst. Examples of the preferred monomers referred to herein include dicyclopentadiene, 2-norbornene, and other norbornene monomers such as
5-methyl-2-norbornene,
5,6-dimethyl-2-norbornene,
5-ethyl-2-norbornene,
5-ethylidenyl-2-norbornene    (or 5-ethylidene-norbornene),
5-butyl-2-norbornene,
5-hexyl-2-norbornene,
5-octyl-2-norbornene,
5-phenyl-2-norbornene,
5-dodecyl-2-norbornene,
5-isobutyl-2-norbornene,
5-octadecyl-2-norbornene,
5-isopropyl-2-norbornene,
5-phenyl-2-norbornene,
5-p-toluyl-2-norbornene,
5-α-naphthyl-2-norbornene,
5-cyclohexyl-2-norbornene,
5-isopropenyl-norbornene,
5-vinyl-norbornene,
5,5-dimethyl-2-norbornene,
tricyclopentadiene (or cyclopentadiene trimer),
tetracyclopentadiene (or cyclopentadiene tetramer),
dihydrodicyclopentadiene (or cyclopentene-cyclopentadiene co-dimer),
methyl-cyclopentadiene dimer,
ethyl-cyclopentadiene dimer,
tetracyclododecene,
9-methyl-tetracyclo[6,2,1,1$^{3,6}$,O$^{2,7}$]dodecene-4    (or methyl-tetracyclododecene),
9-ethyl-tetracyclo[6,2,1,1$^{3,6}$,O$^{2,7}$]dodecene-4 (or ethyl-tetracyclododecene),
9-propyl-tetracyclo[6,2,1,1$^{3,6}$,O$^{2,7}$]dodecene-4,
9-hexyl-tetracyclo[6,2,1,1$^{3,6}$,O$^{2,7}$]dodecene-4,
9-decyl-tetracyclo[6,2,1,1$^{3,6}$,O$^{2,7}$]dodecene-4,
9,10-dimethyl-tetracyclo[6,2,1,1$^{3,6}$,O$^{2,7}$]dodecene-4,
9-methyl,10-ethyl-tetracyclo[6,2,1,1$^{3,6}$,O$^{2,7}$]dodecene-4,
9-cyclohexyl-tetracyclo[6,2,1,1$^{3,6}$O$^{2,7}$]dodecene-4,
9-cyclohexyl-tetracyclo[6,2,1,1$^{3,6}$,O$^{2,7}$]dodecene-4,
9-chloro-tetracyclo[6,2,1,1$^{3,6}$O$^{2,7}$]dodecene-4,
9-bromo-tetracyclo[6,2,1,1$^{3,6}$,O$^{2,7}$]dodecene-4,
9-fluoro-tetracyclo[6,2,1,1$^{3,6}$,O$^{2,7}$]dodecene-4,
9-isobutyl-tetracyclo[6,2,1,1$^{3,6}$,O$^{2,7}$]dodecene-4, and
9,10-dichloro-tetracyclo[6,2,1,1$^{3,6}$O$^{2,7}$]dodecene-4.

This invention especially contemplates the use of one or more of these monomers so as to provide either homopolymers or copolymers upon polymerization.

Other monomers can form part of the polynorbornenes such as non-conjugated acyclic olefins, monocyclic olefins and diolefins. The non-conjugated acyclic olefins act as chain terminators in the ring opening polymerization. Terminal olefins are most preferred, e.g., alpha-olefins. Thus monomers like hexene-1 are preferred while 1-butene, 2-pentene, 4-methyl2 2-pentene, and 5-ethyl-3-octene are suitable also. They are typically used at a molar ratio of 0.001:1 to 0.5:1 acyclic olefin to cycloolefin monomer. The polynorbornenes used in forming the printed wire boards of the present invention are obtained by solution polymerization. For solution polymerization, the catalyst preferably comprises molybdenum or tungsten salts and the co-catalyst preferably comprises dialkylaluminum halides, alkylaluminum dihalides, alkylalkoxy halides or a mixture of trialkylaluminum with an iodine source.

Examples of useful molybdenum and tungsten salts include the halides such as chlorides, bromides, iodides, and fluorides. Specific examples of such halides include molybdenum pentachloride, molybdenum hexachloride, molybdenum pentabromide, molybdenum hexabromide, molybdenum pentaiodide, molybdenum hexafluoride, tungsten hexachloride, tungsten hexafluoride and the like. Other representative salts include those of acetylacetonates, sulfates, phosphates, nitrates, and the like. Mixtures of salts can also be used. For polymerization results, the more preferred salts are the molybdenum halides, especially molybdenum pentahalides such as $MoCl_5$.

Specific examples of co-catalysts for ring-opening solution polymerization include alkyl-aluminum halides such as ethylaluminum sesquichloride, diethylaluminum chloride, diethylaluminum iodide, ethylaluminum diiodide, propylaluminum diiodide and ethylpropylaluminum iodide and a mixture of triethylaluminum and elemental iodine.

For solution polymerization, the molybdenum or tungsten salt is generally employed at a level from about 0.01 to about 50 millimoles per mole of total monomer, preferably from about 0.5 to about 10 millimoles per mole of total monomer and the organoaluminum compounds described above are generally used in a molar ratio of organoaluminum compound to molybdenum and/or tungsten salt(s) from about 10/1 to about $\frac{1}{2}$, preferably from about 5/1 to about 3/1. Both catalyst and co-catalyst for solution polymerization are normally added at the time of polymerization.

Suitable solvents used for the solution polymerization and in forming the dipping solution include aliphatic and cycloaliphatic hydrocarbon solvents containing 4 to 10 carbon atoms such as cyclohexane, cyclooctane and the like; aromatic hydrocarbon solvents containing 6 to 14 carbon atoms which are liquid or easily liquified such as benzene, toluene, xylene and the like; and substituted hydrocarbons wherein the substituents are inert such as dichloromethane, chloroform, chlorobenzene, dichlorobenzene and the like.

Optionally present within the dipping solution are curing agents which initiate radical cross-linking such as the peroxides, di-t-butyl peroxide, or 2,5-dimethyl-2,5-di(t-butylperoxy)-hexyne-3. Antioxidants such as hindered phenol antioxidants (Ethyl 330) and polyunsaturated monomeric or oligomeric cross-linkers such as trimethylol-propane triacrylate are also optional. The dipping solution has a solids content of preferably about 10% to about 40%. Dipping solutions having concentrations both above and below this range can be used in forming the laminates of the invention.

The dipping solution is impregnated into a non-cellulosic cloth, such as fiberglass, to form a substrate layer, often referred to as a prepreg. The cloth may be woven or non-woven. Many glass cloth materials having a variety of surface characteristics are available commercially. In the present invention E-type fiberglass cloth, style 2116, having a surface finish type 642 or 627 (which refers to a silane treatment) made by Burlington Industries is preferred. The non-cellulosic cloth is impregnated by immersing it in the dipping solution of the polynorbornene diluted in an organic solvent. This can be accomplished at ambient temperatures or at the temperatures above or below ambient temperatures.

An amount of copolymer sufficient to provide a weight-to-weight ratio of copolymer to glass in the finished prepreg of from about 30:70 to about 80:20 on a weight-to-weight basis is suitably employed. Preferably amounts to provide from about 40:60 to about 70:30, and most preferably from about 50:50 to about 65:35 are employed.

The glass cloth may be pretreated with a silane solution. A preferred class of pretreating agents is the styryl-diamino-alkoxy silanes.

The prepreg so produced is typically dried at temperatures between ambient temperature and about 150° C. At final stages of drying the temperature is preferably maintained above the glass transition temperature (Tg) of the polymer to permit the solvent to diffuse out. If curing agents are present, the temperature is kept sufficiently low to prevent activation of radical cross-linking.

The laminates produced by the present invention incorporate a conductive foil, preferably a copper film with a copper surface layer, such as copper foil. This copper foil can be the surface layer of other metallic films. The copper surface layer is pretreated with a silane solution which increases the bond strength between the substrate and the copper surface layer. Prior to lamination the copper foil can be treated for example, for 1 minute by dipping in a 0.4% solution of 3-(N-styrylmethyl-2-amino-ethyl)-aminopropyltrimethoxysilane hydrochloride in methanol as an adhesion promoter. The treated foil can be subjected to a short bake for 5 minutes at 105° C. Preferably, copper foil of the type manufactured for printed wiring boards with a matte side for lamination to a prepreg is pretreated with such a solution of silane coupling agent before being laminated to the prepreg. Such copper foils are typically about 35 microns thick and have a dendritic bronze matte surface.

It is also feasible to employ a composite conductive sheet in which one face of the sheet is copper and the other is an appropriate metal such as tin, silver, gold, solder, aluminum, platinum, titanium, zinc, chrome, or an alloy of or more of these metals with each other or copper. Additionally, the conductive foil may be composed of entirely only one of the above metals. Particularly suitable metal foils or films are available from Gould, Inc.

Laminates, such as printed circuit wiring boards, can be prepared by laminating the pre-treated conductive layer to the substrate layer (prepreg). The lamination steps can involve fully conventional conditions well-known to those of ordinary skill in the art. For example, on e of ordinary skill in the art can easily determine optimum pressure and temperature conditions at which the lamination should be carried out, perhaps with a few routine optimization experiments. Lamination can suitably be accomplished in a heated press using pressures above about 700 psi, preferably 1,000–1,100 psi, and at temperatures between ambient temperature and 250° C., but preferably between 170° C. and 190° C. Preferably, the lamination temperature is above the glass transition temperature of the polymer and is sufficiently high to activate any curing agents which are employed, e.g., peroxide curing agents. At such temperatures, the curing agents, particularly peroxide curing agents will release an oxygen free-radical which causes cross-linking. Cross-linking provides strength and chemical resistance to the boards. Generally, a stack of prepregs can be pressed between a pair of pre-treated copper foils. The pre-treated bronze side of the copper foil is placed in contact with the prepreg.

Many of the silane-substituted monomers of this invention are readily commercially available. Moreover, the silane-substituted monomers of this invention may be easily prepared by introducing silicon atoms into the polynorbornenes. This is accomplished by reacting a diene monomer (cycloolefin monomer) with a dieneophile containing silicon. For example, a silane-substituted monomer can be prepared from cyclopentadiene and a dieneophile containing silicon. Similarly, a tetracyclododecene should be obtained. This procedure is easily accomplished, and involves fully conventional conditions and materials (e.g., conventional catalysts, etc.) The silane compounds of formula V are prepared in the same way. Those of ordinary skill in the art will readily be able to select the optimum starting materials and reaction conditions.

Suitable silicon-containing dieneophiles are fully conventional, readily available and can be easily selected by those of ordinary skill in the art. Examples of suitable dieneophiles include vinyltriethoxysilane, vinyltrichlorosilane and vinyldichloromethylsiliane. However, many others exist and are readily available.

The silane-substituted monomers are then copolymerized with non silane-substituted monomers to produce a silane-substituted copolymer comprising polycycloolefins. Examples of suitable and preferred silane-substituted monomers include norbornenylsilane, norbornenyl methyldichlorosilane, norbornenyltriethoxysilane (or 5-(bicycloheptene)-2-triethoxysilane), etc. In an exemplary embodiment, 5-(bicycloheptene)-2-triethoxysilane is copolymerized with 2-methyl-5-norbornene to produce a polycycloolefin containing functional silane groups. The copolymerization advantageously takes place under the conditions discussed above.

A ratio of silane-substituted monomer to non silane-substituted monomer of from about 95:5 to about 1:99 is suitably employed on a weight-to-weight basis. Preferably, a ratio of from about 80:50 to about 3:97 is employed and most preferably a ratio of from about 20:80 to about 5:95.

Prepregs produced from such copolymers exhibit improved polymer-glass adhesion, improved plasma etch resistance, lower dielectric constants and lower dissipation factors.

The silane-substituted copolymers of this invention are employed to produce prepregs in the same way that non-silane-substituted polycyloolefins have been employed to produce printed circuit wiring boards. The procedure for producing such wiring boards and related laminates is set forth below:

Step 1

Preparation of 70/30 (wt/wt)
Methyltetracyclododecene (mtd)
5-triethoxysilyl-2-norbornene (SiNB) Copolymer An unsaturated polynorbornene polymer was obtained in the following manner. Into a septum-capped vessel containing 150 g. of molecular sieves were added 400 g. of dry toluene, 80.3 g. of methyl tetracyclododecene, 35 g. triethoxysilyl norbornene and 26.5 g. hexene-1. The contents were mixed and this mixture was allowed to stand 30 minutes, then transferred to a second vessel by passing it through a 1 micron filter under nitrogen pressure. The vessel was slightly pressurized with nitrogen. To the mixture 2.77 cc of a 25% solution of ethyl-sesquichloride (EASC cocatalyst) in dry toluene were introduced by syringe. To this mixture, 9.77 cc of a solution of 2 g. of molybdenum pentachloride catalyst in 39 g. of dry ethylacetate and 84 g. of dry toluene, wee also introduced by syringe. Within one minute, an exothermic reaction of the mixture resulted and the mixture became a viscous liquid. After 15 minutes, 60 cc of 88/12 (wt/wt) mixture of 2-propanol and water was added to the vessel and the contents shaken to inactivate the catalyst. The top layer, containing mostly solvents, residual monomers and lower molecular weight polymers, was poured off. The semisolid bottom layer was redissolved in 100 cc of toluene, washed with water and dried by azeotropic distillation of part of the solvent.

Polymerization was found to be 93% conversion of monomer as calculated by measuring the percent weight solids of the resulting polymer soslution. The glass transition temperature (Tg) was found to be 138° C. in the second heat, as calculated from a Differential Scanning Calorimetry curve of a sample of the polymer that was diluted in toluene, precipitated into methanol with stirring, filtered and dried.

Step 2

Preparation of Prepreg

The prepreg formulation used consisted of a 25% solution of a 70/30 (wt/wt) copolymer of methyltetracyclodocene (MTD) and 5-triethoxysilyl-2-norbornene (SiNB) also containing 3.5 p.h.r. (parts per hundred resin) of Lupersol 130, peroxide from Penwalt Co. Lucidol Division, and 1 p.h.r. of Irganox 1010 antioxidant from Ciba-Geigy Co. The polymer had a dilute solution viscosity (DSV) in toluene of 0.5 and it was obtained by ring opening polymerization of above monomers in toluene, in the presence of hexene-1 as a molecular weight modifier, using molybdenum pentachloride and ethyl-aluminum sesquichloride as the catalyst system.

The above formulation was impregnated, by dipping, onto a glass cloth style 2116, having a finish 642 from Burlington Industries. After air drying to a tack-free condition, the residual solvent was eliminated in a mechanical convection oven for 15 minutes at 50° C., 15 at 75° C., 20 at 100° C. and 10 at 130° C. The residual amount of volatiles was measured to be below 2.5% at 200° C. by Thermogravimetric Analysis.

Step 3 Lamination of Copper Foil to The Prepreg

Two layers of above prepregs were laminated inbetween electrodeposited copper foil, containing a proprietary bronze treatment on the matte side (TC treatment from Gould Inc., Foil Division). The lamination and cure was performed in a press at from 40° to 190° C. for 25 minutes and, isothermally at 190° C. for 3 hrs., using a pressure of 700 psi.

The copper on both sides of the laminate was imaged and etched using a 1 molar solution of ammonium persulfate. The etched board was at this point a cured substituted polynorbornene C-stage board.

The following examples illustrate how various copolymers of this invention perform when employed in printed circuit wiring boards of this invention. In these examples and throughout the specification, all parts and percentages are by weight and all temperatures are in degrees Celsius, unless expressly stated otherwise.

Example 1

Printed circuit wiring boards were prepared from prepregs of glass mat impregnated with various copolymers. The polymers were prepared from monomers according to the following table using molybdenum pentachloride in toluene with added ethyl acetate as catalyst and ethyl aluminum sesquichloride in toluene as cocatalyst. Hexane-1 was used as a chain transfer agent to control molecular weight. The poylmer was formulated in a formulation containing 1% Lupersol 130 and impregnated on a glass cloth having a typical amino silane treatment used for epoxy resin formulations. After cure of the prepregs in a press at 270° C. the adhesion of the polymer to glass determined by scanning electron microscopy of an interface obtained by fracture at liquid nitrogen temperature. The polymers containing the silicon compound showed good adhesion to glass fiber bundles, while a control prepreg made of a polymer of MTD/MNB 90-10 showed poor adhesion at the glass polymer interface. The dielectric constant of the copolymers was then measured at ambient conditions using a GenRad 1687B 1-Megahertz LC Digibridge at a frequency of 1-MH$_z$. The rsults are set forth below.

| # | Polymer Composition (Parts) | | Dielectric Constant |
|---|---|---|---|
| 1 | 70/30 | MTD/SiNB-glass | 3.2 |
| 2 | 70/10/20 | MTD/MNB/SiNB-glass | 3.3 |
| 3 | 70/20/10 | MTD/MNB/SiNB-glass | 3.1 |
| 4 | 70/25/5 | MTD/MNB/SiNB-glass | 3.2 |
| 5 | 70/29/1 | MTD/MNB/SiNB-glass | 3.0 |
| Control | | Epoxy-Glass | 4.1–3.5 |

(FR-4)
MTD = methyl tetracyclododecene
MNB = methylnorbornene
SiNB = 5-(bicycloheptene-2-yl)-triethoxy-silane While the invention has been disclosed in this specification by reference to the details of preferred embodiments of the invention, it is to be understood that the disclosure is intended in an illustrative, rather than in a limiting sense, as it is contemplated that modifications will readily occur to those skilled in the art, within the spirit of the invention and the scope of the appended claims.

What is claimed is:

1. A laminate comprising at least one layer of a non-cellulic cloth impregnated with a copolymer having repeating units derived from silane-substituted and non-silane-substituted monomers of the formulas

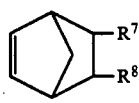

-continued

wherein n=1–4 and $R^7$ and $R^8$ are independently selected from hydrogen, halogen, $C^1$–$C_{12}$ alkyl groups, $C_2$–$C_{12}$ alkylene groups, $C_6$–$C_{12}$ cycloalkyl groups, $C_6$–$C_{12}$ cycloalkylene groups and $C_6$–$C_{12}$ aryl groups, silane or $R^7$ and $R^8$ together form a saturated or unsaturated silane substituted cyclic group of from 4 to 12 carbon atoms with the two ring carbon atoms connected thereto, said ring carbon atoms forming part of and contributing to the 4 to 12 carbon atoms in the cyclic group with the proviso that, when $R^7$ and $R^8$ do not together form said cyclic group, at least one of $R^7$ and $R^8$ is a silane group.

2. A laminate of claim 1 wherein said silane group is a substuent of the formula —$SiR_9R_{10}R_{11}$ wherein each of $R_9$, $R_{10}$, $R_{11}$ is selected independently from the group which includes H; halogen; $C_1$–$C_{12}$ alkyl; $C_6$–$C_{12}$ aryl; and $C_6$–$C_{12}$ aryl substituted by $C_1$–$C_{12}$ alkyl; $C_1$–$C_{12}$ alkoxy; and hydroxyl.

3. A laminate of claim 2 wherein said silane group is a trialkoxysilane.

4. A laminate of claim 3 wherein said trialkoxysilane is triethoxysilane.

5. A laminate of claim 2 wherein said silane group is an alkylalkoxy silane.

6. A laminate of claim 1 wherein the ratio of silane-substituted monomer to non silane-substituted monomer from about 95:5 to about 1:99.

7. A laminate of claim 1 wherein the ratio of polycyloolefin copolymer to glass cloth is from about 75:25 to about 30:70.

8. A laminate of claim 1 which further comprises a copper film that has been pretreated with a bronze coating adhered to said laminate.

9. A laminate of claim 1 wherein at least one monomer of the polycycloolefin is unsaturated and derived from a cycloolefin monomer selected from methylnorbornene, methyltetracyclododecene, tetracyclododecene, vinyl-norbornene or dicyclopentadiene.

10. A laminate of claim 1 wherein said polycyclic copolymer is derived form silane- substituted and non silane-substituted monomers selected from dicyclopentadiene,
2-norbornene, and other norbornene monomers such as
5-methyl-2-norbornene,
5,6-dimethyl-2-norbornene,
5-ethyl-2-norbornene,
5-ethylidenyl-2-norbornene (or5-ethylidene-norbornene),
5-butyl-2-norbornene,
5-hexyl-2-norbornene,
5-octyl-2-norbornene,
5-phenyl-2-norbornene,
5-dodecyl-2-norbornene,
5-isobutyl-2-norbornene,
5-octadecyl-2-norbornene,
5-isopropyl-2-norbornene,
5-phenyl-2-norbornene,
5-p-toluyl-2-norbornene,
5-α-naphthyl-2-norbornene,
5-cyclohexyl-2-norbornene,
5-isopropenyl-norbornene, 5-vinyl-norbornene,
5,5-dimethyl-2-norbornene,
tricyclopentadiene (or cyclopentadiene trimer),
tetracyclopentadiene (or cyclopentadiene tetramer),
dihydrodicyclopentadiene (or cyclopentene-cyclopentadiene co-dimer),
methyl-cyclopentadiene dimer,
ethyl-cyclopentadiene dimer,
tetracyclododecene,
9-methyl-tetracyclo[6,2,1,1$^{3,6}$,O$^{2,7}$]dodecene-4 (or methyl-tetracyclododecene),
9-ethyl-tetracyclo[6,2,1,1$^{3,6}$,O$^{2,7}$]dodecene-4 (or ethyl-tetracyclododecene),
9-propyl-tetracyclo[6,2,1,1$^{3,6}$,O$^{2,7}$]dodecene-4,
9-hexyl-tetracyclo[6,2,1,1$^{3,6}$,O$^{2,7}$]dodecene-4,
9-decyl-tetracyclo[6,2,1,1$^{3,6}$,O$^{2,7}$]dodecene-4,
9,10-dimethyl-tetracyclo[6,2,1,1$^{3,6}$,O$^{2,7}$]dodecene-4,
9-methyl,10-ethyl-tetracyclo[6,2,1,1$^{3,6}$,O$^{2,7}$]dodecene-4,
9-cyclohexyl-tetracyclo[6,2,1,1$^{3,6}$O$^{2,7}$]dodecene-4,
9-cyclohexyl-tetracyclo[6,2,1,1$^{3,6}$,O$^{2,7}$]dodecene-4,
9-chloro-tetracyclo[6,2,1,1$^{3,6}$O$^{2,7}$]dodecene-4,
9-bromo-tetracyclo[6,2,1,1$^{3,6}$,O$^{2,7}$]dodecene-4,
9-fluoro-tetracyclo[6,2,1,1$^{3,6}$,O$^{2,7}$]dodecene-4,
9-isobutyl-tetracyclo[6,2,1,1$^{3,6}$O$^{2,7}$]dodecene-4, and
9,10-dichloro-tetracyclo[6,2,1,1$^{3,6}$O$^{2,7}$]dodecene-4.

* * * * *

UNITED STATES PATENT AND TRADEMARK OFFICE
CERTIFICATE OF CORRECTION

PATENT NO. : 5,190,808
DATED : March 2, 1993
INVENTOR(S) : Linwood P. Tenney, Robert J. Minchak, Timothy J. Kettering, George M. Benedikt, and David J. Smith It is certified that error appears in the above-identified patent and that said Letters Patent is hereby corrected as shown below:

Column 4, line 16, "$R^4$" should read --$R^5$--.
Column 4, line 35, the formula should be represented as follows:

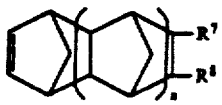

Column 5, line 53, "$C_6-C_{12}$ alkyl" should read --$C_1-C_4$ alkyl--.
Column 6, line 18, a space should be inserted between "or" and "5-ethylidene-norbornene".
Column 6, line 54, the term "9-cyclohexyl-tetracyclo[6,2,1,1$^{3,6}$,0$^{2,7}$]dodecene-4" is redundant and should be deleted.
Column 7, line 1, "4-methyl2-pentene" should read --4-methyl-2-pentene--.
Column 8, line 61, "on e" should read --one--.
Column 10, line 13, "wee" should read --were--.
Column 10, line 26, "soslution" should read --solution--.
Column 11, line 17, "Hexane-1" should read --Hexene-1--.
Column 12, line 54, a space should be inserted between "or" and "5-ethylidene-norbornene".
Column 14, line 8, the term "9-cyclohexyl-tetracyclo[6,2,1,1$^{3,6}$,0$^{2,7}$]dodecene-4" is redundant and should be deleted.
Column 14, line 12, change "and" to --or--.

Signed and Sealed this

Eighteenth Day of January, 1994

Attest:

BRUCE LEHMAN

Attesting Officer      Commissioner of Patents and Trademarks